US 6,612,029 B2

(12) United States Patent
Behin et al.

(10) Patent No.: US 6,612,029 B2
(45) Date of Patent: Sep. 2, 2003

(54) MULTI-LAYER, SELF-ALIGNED VERTICAL COMBDRIVE ELECTROSTATIC ACTUATORS AND FABRICATION METHODS

(75) Inventors: Behrang Behin, Berkeley, CA (US); Satinderpall Pannu, Berkeley, CA (US)

(73) Assignee: Onix Microsystems, Fremont, CA (US)

( * ) Notice: Subject to any disclaimer, the term of this patent is extended or adjusted under 35 U.S.C. 154(b) by 0 days.

(21) Appl. No.: 09/810,335

(22) Filed: Mar. 14, 2001

(65) Prior Publication Data

US 2001/0034938 A1 Nov. 1, 2001

Related U.S. Application Data

(60) Provisional application No. 60/192,097, filed on Mar. 24, 2000.

(51) Int. Cl.⁷ .................... H05K 3/02; H04R 31/00
(52) U.S. Cl. .................. 29/847; 29/830; 29/846; 310/309; 359/254
(58) Field of Search .................. 29/847, 851, 594, 29/595, 603.13, 603.14, 603.15, 603.18

(56) References Cited

U.S. PATENT DOCUMENTS

| | | | |
|---|---|---|---|
| 4,317,611 A | 3/1982 | Petersen | 350/6.6 |
| 4,413,766 A * | 11/1983 | Webster | 228/123 |
| 5,025,346 A | 6/1991 | Tang et al. | 361/283 |
| 5,314,572 A | 5/1994 | Core et al. | 156/643 |
| 5,408,731 A * | 4/1995 | Berggvist et al. | 29/25.41 |
| 5,541,437 A | 7/1996 | Watanabe et al. | 257/417 |
| 5,543,956 A | 8/1996 | Nakagawa et al. | 359/225 |
| 5,565,625 A | 10/1996 | Howe et al. | 73/514.16 |
| 5,867,297 A | 2/1999 | Kiang et al. | 359/198 |
| 5,969,848 A | 10/1999 | Lee et al. | 359/298 |
| 5,995,334 A | 11/1999 | Fan et al. | 360/106 |
| 5,998,906 A | 12/1999 | Jerman et al. | 310/309 |
| 6,000,280 A | 12/1999 | Miller et al. | 73/105 |
| 6,067,858 A | 5/2000 | Clark et al. | 73/504.16 |
| 6,073,484 A | 6/2000 | Miller et al. | 73/105 |
| 6,134,207 A | 10/2000 | Jerman et al. | 369/112 |
| 6,137,941 A | 10/2000 | Robinson | 385/140 |
| 6,133,670 A * | 11/2000 | Rodgers et al. | 310/309 |
| 6,201,629 B1 | 3/2001 | McClelland et al. | 359/223 |
| 6,212,309 B1 | 4/2001 | Nguyen et al. | 385/17 |
| 6,253,612 B1 | 7/2001 | Lemkin et al. | 73/504.02 |
| 6,257,062 B1 | 7/2001 | Rich | 73/514.32 |
| 6,296,779 B1 | 10/2001 | Clark et al. | 216/66 |
| 6,301,403 B1 | 10/2001 | Heanue et al. | 385/18 |
| 6,329,737 B1 | 12/2001 | Jerman et al. | 310/309 |
| 6,360,035 B1 | 3/2002 | Hurst et al. | 385/16 |
| 6,374,008 B2 | 4/2002 | Solgaard et al. | 385/17 |

* cited by examiner

Primary Examiner—Noah P. Kamen
(74) Attorney, Agent, or Firm—JDI Patent; Joshua D. Isenberg

(57) ABSTRACT

A method of fabricating multi-layer vertical comb-drive actuator that includes a first comb structure having a plurality of first comb fingers and a second comb structure having a plurality of second comb fingers, wherein the first and second comb fingers are substantially interdigitated. The present invention includes masking and etching of a structure that contains these multiple layers, wherein the first and second comb fingers are simultaneously fabricated. The first and second comb fingers may include two or more stacked conductive layers electrically isolated from each other by an insulating layer or an air gap. Alternatively, either the first or second comb fingers may include only one conductive layer.

17 Claims, 12 Drawing Sheets

MULTI-LAYER, SELF-ALIGNED VERTICAL COMBDRIVE ELECTROSTATIC ACTUATORS AND FABRICATION METHODS

CROSS-REFERENCE TO RELATED APPLICATIONS

This application is based on Provisional application 60/192,097 filed Mar. 24, 2000, which is herein incorporated by reference.

FIELD OF THE INVENTION

This invention relates generally to microelectromechanical systems (MEMS). More particularly, it relates to vertical comb-drive electrostatic actuators and fabrication methods.

BACKGROUND ART

Microstructures fabricated using silicon integrated processing techniques are used in a wide variety of sensing, actuating, and optical applications. One particularly useful device is a comb-drive actuator, which consists of two comb-like structures, one mobile and one stationary, whose fingers are interdigitated. When a potential difference is applied to the alternating fingers, a resulting electrostatic force causes the mobile fingers to move to maximize the overlap area. While the force provided by each finger is quite small, including a large number of fingers in the comb drive allows for application of relatively large forces using low voltages, particularly when there is a large capacitive overlap area between two adjacent fingers. Comb drives also provide a method for accurate position measurement by sensing of the capacitance of the fingers.

Comb drives are differentiated by the plane of motion of the stationary and mobile combs with respect to one another. Linear or lateral comb-drive actuators provide translational motion in a single plane as the two comb devices move from being relatively spaced apart to being fully interdigitated. The two comb structures remain in the same plane during actuation, with the stationary comb being fixed to a substrate, and the mobile comb moving with respect to the substrate. Examples of lateral comb drives are disclosed in U.S. Pat. Nos. 5,025,346, issued to Tang et al., and 5,998,906, issued to Jerman et al.

It is often desirable to create out-of-plane actuation of various microstructures, such as rotation of mirrors about an axis parallel to a substrate. These rotating mirrors can be used individually or in array form for applications such as adaptive optics, visual displays, or fiber-optic switching. Vertical comb-drive actuators provide rotational motion or translational motion perpendicular to a substrate. A micromachined electrostatic vertical actuator is disclosed in U.S. Pat. No. 5,969,848, issued to Lee et al. The device of Lee et al. contains a set of vertical comb drives, with each drive capable of deflecting one edge of a square mirror. By relying on an asymmetric distribution of electrical fields when a bias voltage is applied between stationary and movable comb fingers, the device of Lee et al. allows a small vertical (i.e. out of the plane of the comb fingers) motion of each mirror edge, at most 1.5 $\mu$m.

Larger movements and more simplified fabrication techniques are provided by staggered vertical comb drives, in which the stationary and moving comb drives are positioned parallel to one another, but with the plane of the moving comb above the plane of the stationary comb. The stationary comb fingers are an integral part of the substrate, while the moving comb is fixed to the substrate only through flexures. Applying a voltage between the two comb layers causes the moving comb teeth to be attracted to the stationary teeth and move to increase the overlap area, thereby exerting a force on the moving comb. Conventional fabrication techniques for vertical comb drives using standard photolithography processes require multiple steps for patterning the comb fingers. First, one set of comb teeth is fabricated on a first wafer layer. A second wafer layer is then bonded on top of the first wafer layer, followed by patterning and etching of a second layer to form the second set of comb teeth. The two wafer layers must be aligned to a very high precision; typical applications require comb fingers of 2 $\mu$m wide with a 6 $\mu$m separation distance, so that adjacent overlapped fingers are separated by only 2 $\mu$m. Fabrication of vertical comb drives using this technique is prone to alignment problems. The steppers used to align the individual die on a wafer typically have a lateral resolution of ±0.25 $\mu$m. This resolution places a lower limit on the gap between adjacent comb fingers of about 2 $\mu$m. Because two adjacent fingers are at different potentials during operation, they cannot contact each other. At high actuation voltages, errors in alignment of the fingers can cause sideways motion and instability in the comb drive. As a result, conventional fabrication techniques typically have low production yields.

There is a need, therefore, for a vertical comb drive that can be fabricated in fewer steps than required by conventional fabrication methods, and that provides accurate alignment between two layers of comb fingers without requiring complicated alignment procedures.

SUMMARY

The present invention provides a multi-layer vertical comb drive actuator in which first and second comb fingers are simultaneously fabricated from a single multi-layer substrate. Because the fingers are fabricated together, the tedious alignment of the first and second fingers, required for fabricating conventional vertical comb-drive actuators, is avoided. Alignment is a direct result of the mask used in fabrication; thus the device is referred to as self-aligned. Each finger has two vertical conductive layers separated by an insulating layer or an air gap, and movement is provided by attraction of opposite layers of the first and second comb fingers.

The present invention provides a multi-layer vertical comb drive actuator containing a first comb structure having a plurality of first comb fingers, and a second comb structure having a plurality of second comb fingers. The second comb fingers extend from a comb bridge connected to the substrate through one or more flexures allowing vertical movement or rotational movement about an axis, and are positioned to be interdigitated with the first comb fingers. A movable element is attached to the rotatable flexure and coupled to the second comb structure. In one embodiment, both the first comb fingers and the second comb fingers may include first and second conductive layers electrically isolated from each other by an insulating layer or air gap. The first conductive layers of the first comb fingers may be substantially aligned with the first conductive layers of the second comb fingers, and the second conductive layers of the first comb fingers may be substantially aligned with the second conductive layers of the second comb fingers. In an alternate embodiment, the second comb fingers may have only a first conductive layer in vertical alignment with the first conductive layer of the first comb fingers. In a further alternative embodiment, the second comb fingers have first and second conductive layers electrically isolated from each other by an insulating layer or air gap, and the first comb fingers have only a first conductive layer in alignment with the first conductive layer of the second comb fingers. In all embodiments, applying a voltage between the first and second layers of both first and second fingers causes the second comb structure to deflect, thereby maximizing the overlap area between the opposite layers of the first and second comb fingers. This vertical motion can be used to cause rotation if the movable element is mounted with a rotational degree of freedom.

Preferably, the actuator also has a position sensor for measuring the position of the movable element, and such position telemetry is fed into a feedback mechanism coupled to the voltage source for controlling the position of the moveable element. Combdrive fingers can also perform a position sensing function in addition to driving the angular rotation of the movable element attached thereto, by reading the capacitance of the fingers, indicating a position of the movable element. This position sensor embodiment may include capacitive sensing between any combinations of the comb layers. Alternatively, other position sensors, such as gap closing electrodes, additional comb fingers, piezoresistive strain gauges, coils, magnets, piezoelectric sensors and optical sensors, can be used to track the position of the movable element by one skilled in the art.

The actuator may have a feedback mechanism coupled to the position sensor and the voltage source for controlling the position of the movable element. The various position sensors may be used in tandem to increase the position tracking accuracy of the sensor. Furthermore, A first sensor can be linked to a second position sensor to configure or tune the second sensor enabling better accuracy position tracking than otherwise provided by two unlinked sensors.

Actuators of the present invention may be one-dimensional or two-dimensional gimbaled actuators. In a two-dimensional actuator the rotatable flexure may be attached to a frame, which may be mechanically engaged with a second rotatable flexure attached to a substrate and disposed along a second axis. The frame may also be coupled with a fourth comb structure that may have a plurality of fourth comb fingers that may be substantially co-planar with a plurality of third comb fingers extending from a third comb structure. Either or both of the third and fourth comb fingers may include first and second conductive layers electrically isolated from each other by an insulating layer, an air gap or by any means as one skilled in the art would be capable of applying. Third comb fingers and fourth comb fingers may be substantially interdigitated in a second predetermined engagement. The second axis may be substantially orthogonal to the first axis in this embodiment. Two independent voltages may be applied to control rotation of the actuator in two orthogonal first and second axes.

Also provided is a method of fabricating the different embodiments of the multi-layer vertical comb-drive actuator of the present invention. The method contains the following steps: providing a multi-layer structure having first and second conductive layers separated by an insulating layer, and etching a top pattern in the first and second conductive layers and insulating layer to define the second and first comb fingers. The substrate may also have additional layers that are etched to define the bottom surfaces of the fingers.

In an alternate embodiment of the fabricating method, the first conductive layer may be removed from either the second or the first fingers in an additional step, to leave only the second conductive layer.

DETAILED DESCRIPTION

Although the following detailed description contains many specifics for the purposes of illustration, anyone of ordinary skill in the art will appreciate that many variations and alterations to the following details are within the scope of the invention. Accordingly, the following embodiments of the invention are set forth without any loss of generality to, and without imposing limitations upon, the claimed invention.

The present invention provides a multi-layer vertical comb-drive actuator. Rather than being in different planes, the second comb fingers and first comb fingers lie in the same plane, each having first and second conductive layers separated by an insulating material, layer or air gap. The opposite layers of the second and first structures may be attracted to each other when voltage is applied between opposite layers of the first and second comb fingers, thus providing vertical and/or rotational motion.

Figure 1A:
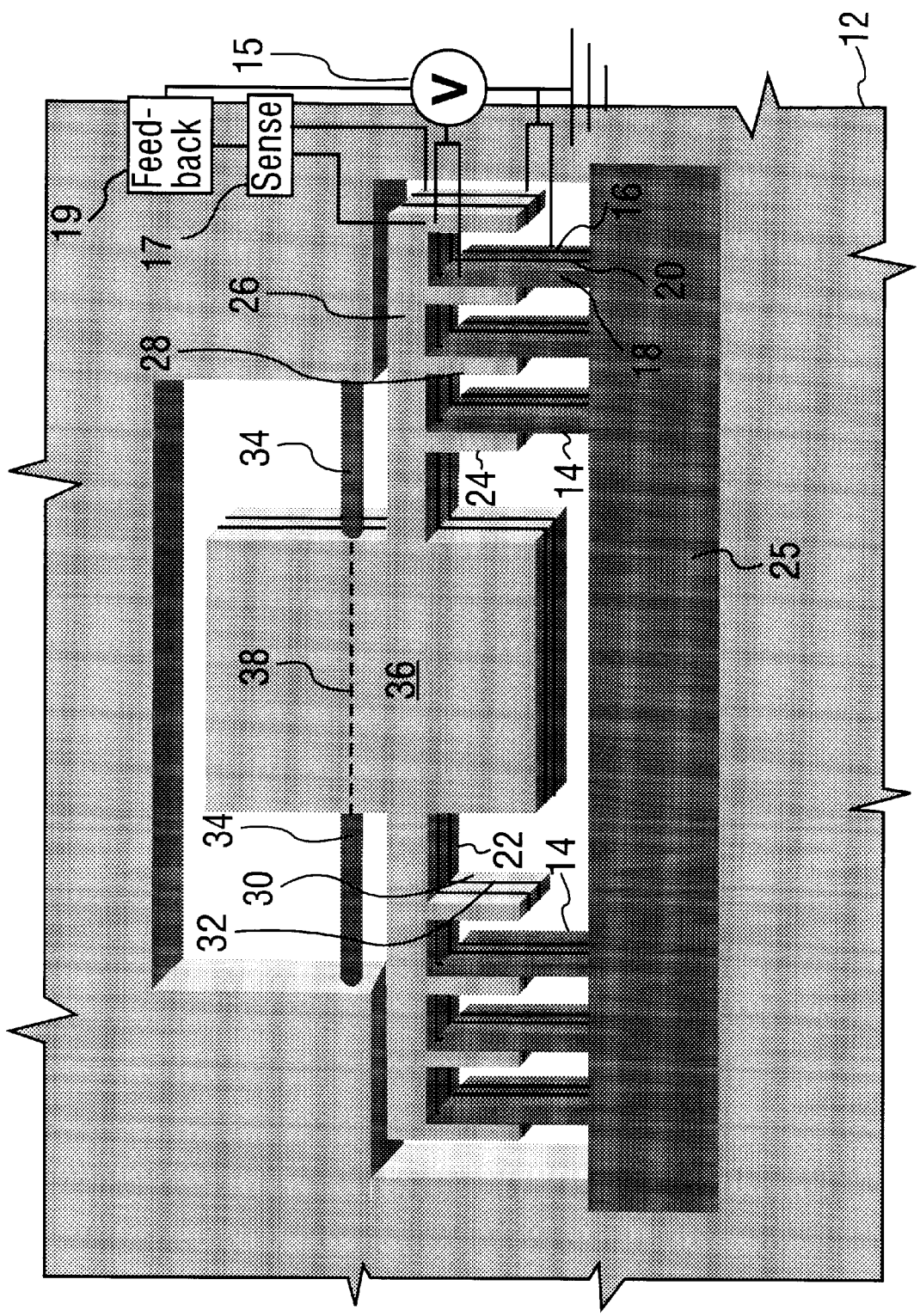
FIGS. 1A–1C are simplified schematic diagrams of multi-layer comb-drive actuators according to a first embodiment of the present invention.

A preferred embodiment of a multi-layer vertical comb-drive actuator 10 of the present invention is shown in FIG. 1A. The actuator 10 is formed on a substrate 12. A first comb structure 25, may be attached to the substrate 12 contain first comb fingers 14 that may have first conductive layers 16 and second conductive layers 18, which may be electrically isolated from each other by a first insulating layer 20. A second comb structure 22 may contain second comb fingers 24 that may extend from a comb bridge 26. The first comb fingers 14 may interdigitate with the second comb fingers 24. By way of example, the width of comb fingers 14 and 24 may be approximately 6 $\mu$m, with a separation distance between adjacent fingers of approximately 2 $\mu$m. The first comb structure 25 may be electrically isolated from the second comb structure 22 and/or the substrate 12.

In the embodiment shown in FIG. 1A, the second comb fingers 24 and comb bridge 26 may have first conductive layers 30 and second conductive layers 28 electrically isolated from each other by an insulating layer 32. The insulating layers 20, 32 of the first and second comb fingers 14, 24 may include layers of insulating materials, such as silicon oxide or an insulating air gap. The first and second conductive layers 28, 30 of the second comb fingers 24 may be substantially aligned with the corresponding first and second conductive layers 16, 18 of the first comb fingers 14.

A movable element 36 is mechanically coupled to the second comb structure 22 and the substrate 12 by a flexure 34. The flexure 34 may be a rotatable flexure that allows the movable element 36 to rotate about an axis 38. Such a rotatable flexure may be any structure suitable for providing a torque that counters rotation of the movable element 36 about the axis 38, such as one or more torsion hinges, cantilever flexures, serpentine flexures, or pin-and-staple hinges combined with one or more springs. The flexure 34 may also be a flexible member that allows vertical movement of the movable element with respect to the plane of the substrate 12. Alternatively, the torque that counters the movement of the moveable element 36 can be provided non-mechanically in a controlled, fixed and variable mode by application of e.g. magnetic or electrical forces onto the moveable element, or by controllably coupling the torque through piezoelectric strain gauge. Non-mechanical torque is useful to provide torsion force, for example, when using a pin and staple hinge flexure that otherwise would not provide a restoring force directed to the movable element Operation of actuator 10 may be configured to share similarity to the operation of a conventional vertical comb-drive actuator. In one mode of operation, a voltage source 15 may apply a voltage between the first conductive layers 16, 30 and the second conductive layers 18, 28 respectively of the first and second comb finger 14, 24. In the embodiment depicted in FIG. 1A, the first conductive layers 16, 30 of the first and second comb fingers 14, 24 may be grounded and the voltage source 15 applies a voltage to the second conductive layers 18, 28 of the first and second comb fingers 14, 24. As a result of the applied potential difference, the first conductive layers 30 of the second comb fingers 24 are attracted to the second conductive layers 18 of the first comb finger 14. The attraction causes the second comb structure 22 to move relative to the first comb structure 25, which, in turn, causes the movable element 36 to rotate about the axis 38.

Although FIG. 1A depicts a voltage applied to the second conductive layers 18, 28, while the first conductive layers 16, 30 are grounded, the invention is in no way limited to this particular configuration for applying a voltage between the first and second layers. The second conductive layers 18,28 may be grounded while the voltage source 15 applies voltage to the first conductive layers 16, 30. Alternatively, the voltage source 15 may apply voltages of opposite polarity to the first and second conductive layers of the first and second comb fingers 14, 24. Voltage applied between the first and second comb fingers can be passed through various wave shaping schemes to optimize control of the movable element. Other methods of applying voltage between the first and second comb fingers are well known to those of average skill in the art.

A typical method of actuating the actuator 10 of FIG. 1A is to apply a voltage between the second conductive layers 18 and 28 of the second 24 and first 14 comb fingers and the first conductive layers 30 and 16 of the second 24 and first 14 comb fingers. In this configuration, the second comb finger 24 is in a state of unstable equilibrium in its nominal sate, and can rotate either upwards or downwards, since for any given voltage, there are two stable states. In one of the stable states, the first conductive portion 30 of the second comb fingers 24 may be engaged with the second conductive portion 18 of the first comb fingers 14, while in the other of the two stable states, the second conductive portion 28 of the second comb fingers 24 is engaged with the first conductive portion 16 of the static comb fingers 14.

To alleviate this ambiguity, a more complex actuation scheme can be employed. Such a scheme requires the use of more than two voltages on the four conductive portions of the comb fingers. For example, the first conductive layers 16 and 30 of both the first 14 and second 24 comb finger can be kept at ground, while the second conductive layer 18 of the first comb 14 can be kept at V, and the second conductive layer 28 of the second comb 24 at V+dV, where dV is some additional voltage. This causes the second comb structure 22 to move down relative to the static comb structure 25. The actuation scheme can be quickly turned back to the original dual-voltage scheme once a preferred direction is established. Also, this scheme can be reversed to move the second comb fingers upward. Similar actuation schemes employing different voltages may also be employed to give the actuator a preferred direction of motion.

A major advantage of the multi-level vertical comb drive of the present invention is the ability to have push-pull actuation. Voltage differences on neighboring electrodes can only generate attractive forces. In conventional comb-drive actuators, a comb drive is used to pull an actuator in one direction, and a mechanical spring force or an opposing comb drive oriented opposite the first are used to pull it in the opposite direction. The present invention is unique in allowing a single set of comb fingers to pull the second structure in opposite directions, or in other words, to both pull and push the second structure. Push-pull actuation allows for a greater freedom to alter key system parameters using feedback schemes. Push-pull schemes allow both the damping ratio and natural frequency of the system to be varied, while pull schemes only allow for the damping ratio to be varied. In the prior art vertical comb drives, only pull actuation methods are available. The pull actuation method of actuator 10 of FIG. 1A is described above. An example of push-pull actuation follows. The actuator can be brought to a certain position by application of a voltage to the second conductive portions 18 and 28 of both the first 14 and second 24 comb fingers, while keeping the first conductive layers 16 and 30 at ground. To push the actuator back to its rest position with a larger force than provided by the flexures, the polarity of the voltages on the two layers of either the first comb fingers 14 or the second comb fingers 24 can be reversed. The dynamics of the movable element can be altered by the application of simultaneous push-pull forces. The actuator 10 may also be provided with a position sensor sense element for measuring a capacitance between the first and second comb fingers. For example, as shown in FIG. 1A, a sense element 17 may be coupled to a feedback element 19 that is coupled to the voltage source 15. The position sensor sense element 17 and feedback element 19 may be implemented in hardware, software or some combination of both such as an application specific integrated circuit (ASIC). Many sensing and feedback schemes are possible. For example, the sense element 17 may measure an amount of charge transferred to or from the comb fingers in response to the voltage applied by the voltage source 15. Alternatively, the position sense element 17 may apply a high frequency dither to either first or second comb fingers. The position sensor sense element 17 may then sense a return signal at the comb fingers not driven. A phase difference between the dither signal and return signal determines the capacitance. Such capacitance can be correlated with the relative positions of the second and first comb drives to obtain a very precise position measurement.

The position measurement may then be fed back to the voltage source 15 via the feedback element 19 to control the relative position of the movable element 36.

A differential capacitance measurement method may also be employed. This allows for greater sensitivity and intolerance to environmental variations such as temperature. In a differential capacitance sensing scheme, multiple capacitances are sensed, and the position may be calculated by using these multiple capacitive measurements. For example, sense element 17 of FIG. 1A could sense the capacitance between the first conductive layer 30 of the second comb fingers 24 and the first conductive layer 16 of the first comb fingers 14, and comparing it with the capacitance between the first conductive layer 30 of the second comb fingers 14 and the second conductive layer 18 of the first comb fingers 14. Alternatively, a single capacitance may be sensed between any two electrically isolated layers, e.g., layers 30 and 16, layers 18 and 28, layers 16 and 28, or layers 18 and 30. Similar methods may be employed with the structures in FIGS. 1B and 1C.

The present invention accommodates alternative position sensors comprised of gap closing electrodes, additional comb fingers, piezoresistive strain gauges, coils, magnets, piezoelectric sensors, optical sensors and combinations thereof.

Figure 1B:
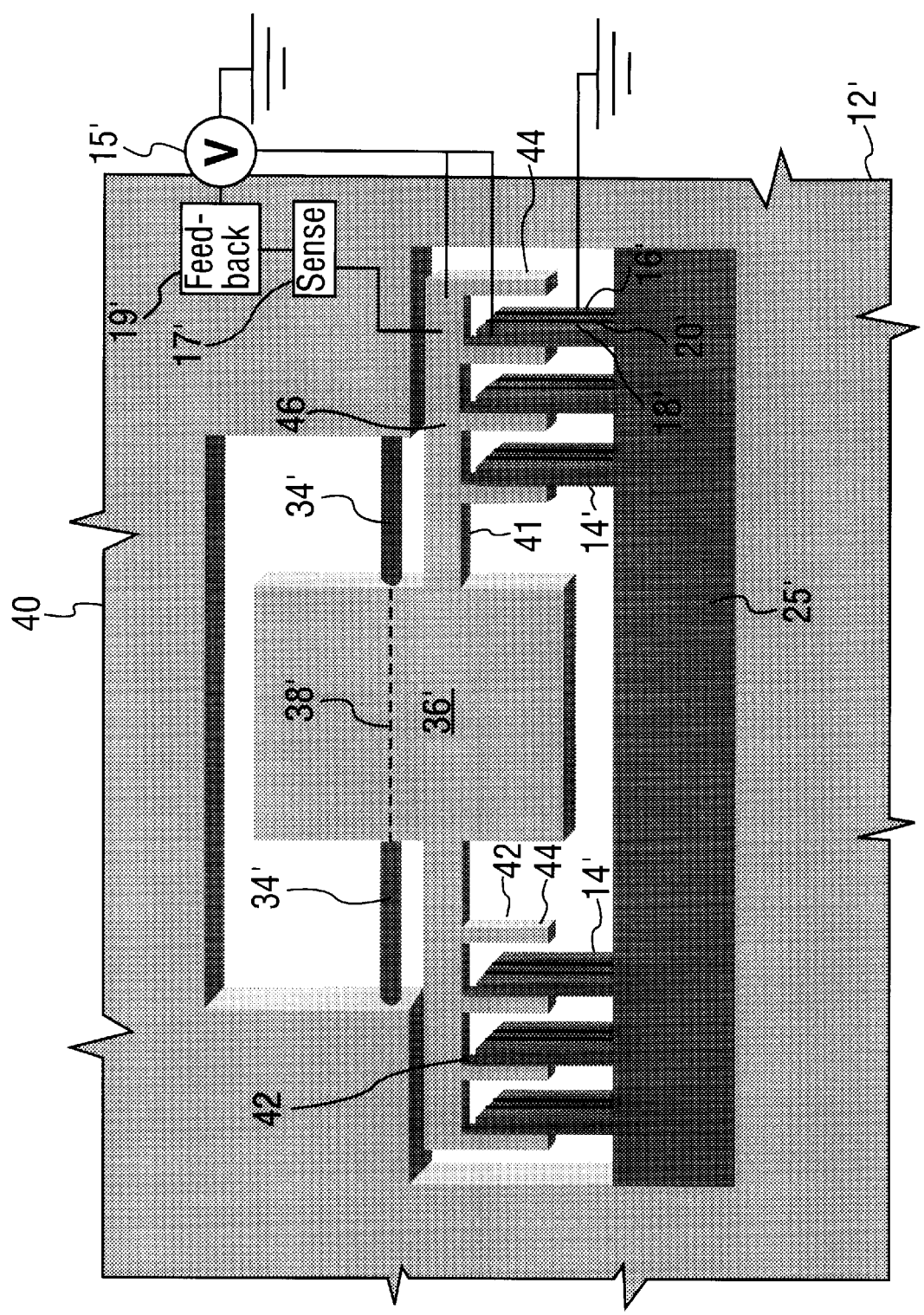

FIG. 1B shows an alternate embodiment of a multi-layer comb-drive actuator 40 of the present invention. Actuator 40 may share similarity to actuator 10. The actuator 40 may generally include a first comb structure 25' mechanically coupled to a substrate 12' and a second comb structure 41 attached to a movable element 36'. The movable element 36' may be mechanically coupled to the substrate by one or more flexures 34', e.g., for rotation about an axis 38'. The second comb structure 41 may include second comb fingers 42 that extend from a comb bridge 46. One or more second comb fingers 42 of the second comb structure 41 have only a first conductive layer 44, and do not have second conductive layers or insulating layers.

The first comb structure 25' may have first comb fingers 14' that interdigitate with the second comb fingers 42. The first comb fingers may include first and second conductive layers 16', 18' electrically isolated by an insulating layer 20' or by an air gap. The first conductive layer 16' of the first comb fingers 14' may be substantially aligned with the first conductive layer 44 of the second comb fingers. Alternatively, the second conductive layer 18' of the first comb fingers 14' may be substantially aligned with the first conductive layer 44 of the second comb fingers.

Actuator 40 may be configured to operate similar to that of actuator 10. For example, a voltage source 15' may apply a voltage difference between the conductive layer 44 of the second comb fingers 42 and either of the conductive layers 16', 18' of the first comb fingers 14'. The voltage source 15' may also be coupled to a sense element 17' and feedback element 19' as described above.

Figure 1C:
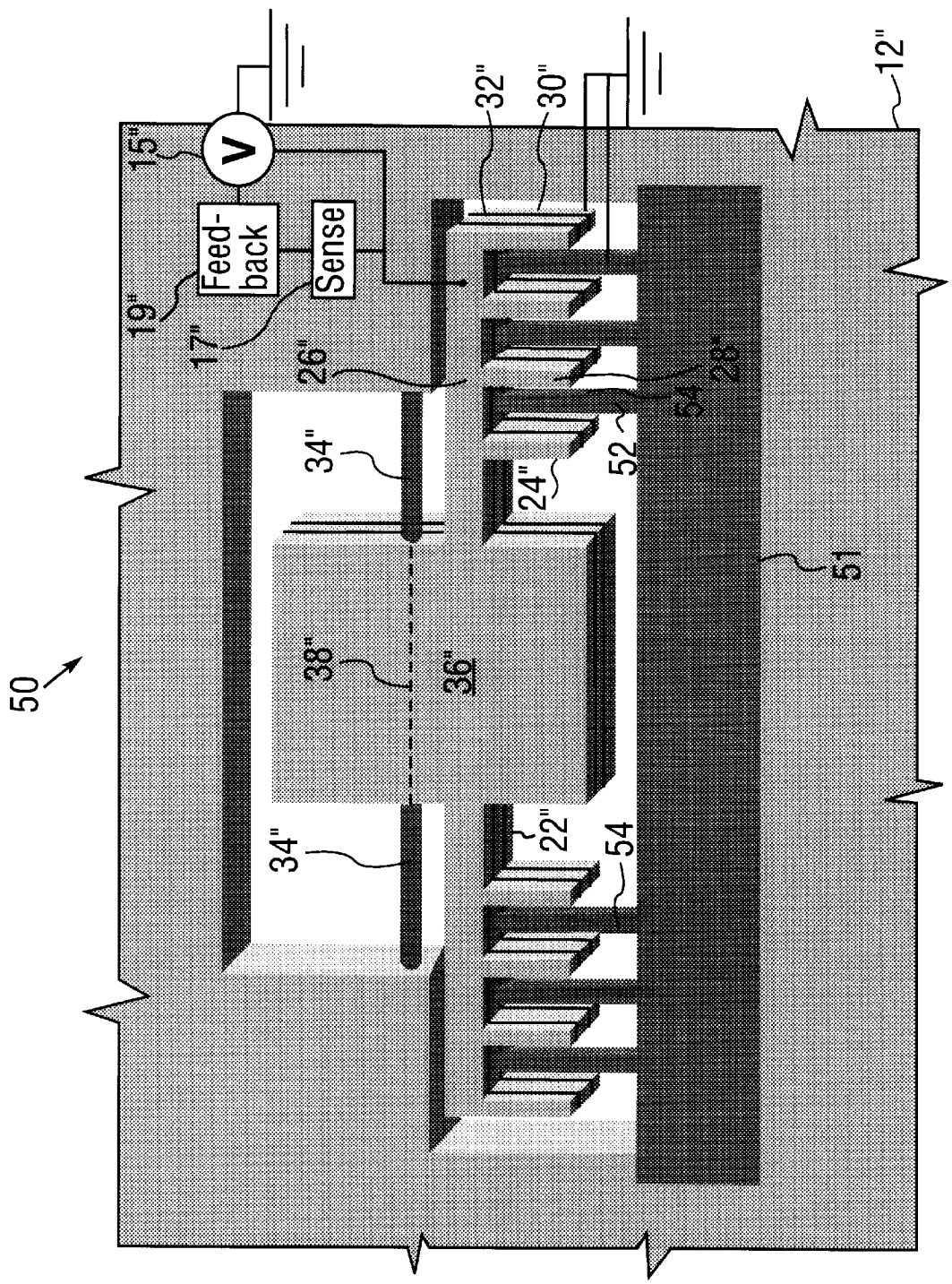

FIG. 1C shows a further alternate embodiment of a multi-layer comb-drive actuator 50 that generally includes a first comb structure 51 mechanically coupled to a substrate 12" and a second comb structure 22" attached to a movable element 36". The movable element 36" may be mechanically coupled to the substrate by one or more flexures 34", e.g., for rotation about an axis 38". The second comb structure 22" may have second comb fingers 24" that extend from a comb bridge 26". The comb bridge 26" and second comb fingers 24" may have first and second conductive layers, 28", 30" electrically isolated by an insulating layer 32". The first comb structure 51 may be similar to the first comb structure 25 of FIG. 1A except that one or more first comb fingers 52 of the second comb structure 51 may have only first conductive layers 54, and may not have second conductive layers or insulating layers. The first conductive layer 54 of the first comb fingers 52 may be substantially aligned with the first conductive layer 30" of the second comb fingers 24". Alternatively, the first conductive layer 54 of the first comb fingers 52 may be substantially aligned with the second conductive layer 28" of the second comb fingers.

Actuator 50 can be configured to operate similar to that of actuator 10 and/or actuator 40. For example, a voltage source 15" may apply a voltage difference between the conductive layer 54 of the comb fingers 52 and either of the conducting layers 28", 30" of the second comb structure 22". The voltage source 15" may also be coupled to a sense element 17" and feedback element 19" as described above. The dynamics of the movable element can be altered by the application of simultaneous push-pull forces.

When actuators 10, 40, or 50 are used for positioning a movable element, such as a micromirror, the mirror may be formed integrally with the second comb structure. Rotation of the second comb structure may cause the mirror to tilt, and the rotational flexures 34, 34", 34" may provide a restoring torque. The actuation mechanism may be integrated with the mirror during manufacture, and may be linear and stable over quite a large range of motion. A relatively large torque allows actuation at high speed, and enables large-angle steady-state beam positioning. Furthermore, the integrated device allows for capacitive position sensing. Thus the integrated device provides significant advantages over existing magnetic, piezoelectric, and gap-closing actuators. However, The existing stated actuators can be used in coordination with the present invention to modify the dynamic characteristics of the movable element as desired by the application.

Figure 1D:
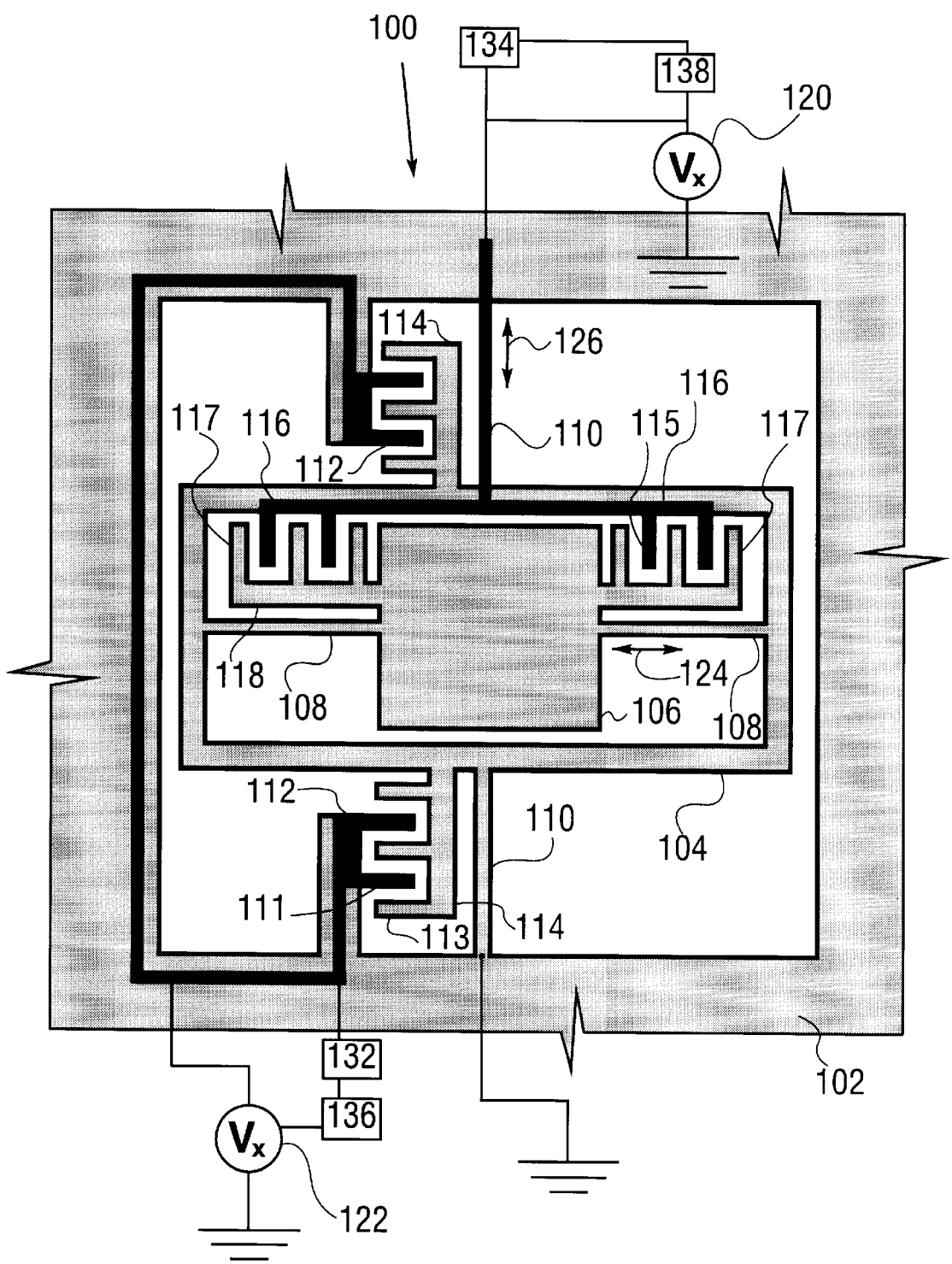
FIG. 1D is a simplified plan view of a two-dimensional rotating actuator according to an alternative embodiment of the present invention.

The present invention further provide a two-dimensional rotating actuator including two multi-layer vertical comb-drives of the types depicted in FIGS. 1A–C, which are arranged in a gimbaled structure and a rotating element mechanically coupled to both of the comb-drives as shown in FIG. 1D according to an alternative embodiment of the present invention. As shown in FIG. 1D, in a two-dimensional rotating actuator 100, a second comb structure 118 having a plurality of second comb fingers 117 that substantially interdigitate with a plurality of first comb fingers 115 extending from a first comb structure 116. Either or both of the first and second comb fingers 115 and 117 may include two conductive layers separated by an insulating layer or an air gap as described in FIGS. 1A–C. First comb fingers 115 and second comb fingers 117 may be substantially interdigitated in a first predetermined engagement. Note that in the embodiment of FIG. 1D, first comb fingers 115 are electrically isolated from second comb fingers 117, the substrate 102, frame 104 and rotating element 106.

The rotating element 106 may include a reflecting surface so that the device 100 may operate as a MEMS mirror. The rotating element 106 may be attached to a first rotatable flexure 108 disposed along a first axis 124. Rotating element 106 may also be mechanically engaged with second comb structure 118 along with first movable comb fingers 117. First rotatable flexure 108 may be attached to a frame 104, which in turn may be mechanically engaged with a second rotatable flexure 110 attached to a substrate 102 and disposed along a second axis 126. Frame 104 may also be coupled with a fourth comb structure 114 having a plurality of fourth comb fingers 113 that substantially interdigitate with a plurality of third comb fingers 111 extending from a third comb structure 112. The second comb structure 112 may be electrically isolated from the substrate 102, the frame 104, the rotating element 106, and the fourth comb fingers 113. Either or both of the third and fourth comb fingers 111 and 113 may include two conductive layers separated by an insulating layer or an air gap as described in FIGS. 1A–C. Third comb fingers 111 and fourth comb fingers 113 are substantially interdigitated in a second predetermined engagement. Third comb fingers 111 are likewise electrically isolated from fourth comb fingers 113. Moreover, first comb fingers 115 may be made to be electrically isolated from third comb fingers 111. As such, the first and second comb-drives are coupled by way of frame 104. First axis 124 is configured to be substantially orthogonal to second axis 126 in this embodiment.

It should be noted that first and second rotatable flexures 108, 110, frame 104, rotating element 106, together with the first and second comb-drives, may be substantially co-planar. Furthermore, the rotatable flexures 108, 110 may be any structure suitable for providing a torque that counters rotation of the second comb fingers about the first axis 124, such as one or more torsion hinges, cantilever flexures, serpentine flexures or pin-and-staple hinges combined with one or more springs. Non-mechanical torque can be dynamically provided through other stated principals, including magnetic principles, and that the telemetry sensing of a first flexure may be linked to dynamically configure a second torque element to achieve higher accuracy torsion control than the two unlinked elements could otherwise provide.

Applying a voltage from a source 120 between the second comb fingers 117 and the first comb fingers 115 attracts the second comb fingers 117 to the first comb fingers 115, which causes the first comb structure 118 to move vertically relative to the second comb structure 116. Thus a torque is exerted on the rotating element 106, which causes the rotating element 106 to rotate about the first axis 124. Applying another voltage from another source 122 between the fourth comb fingers 113 and the third comb fingers 111 attracts the fourth comb fingers 113 to the third comb fingers 111, which causes the fourth comb structure 114 to move vertically relative to the third comb structure 112. Thus, a torque is exerted on the frame 104, which causes the frame 104 to rotate about the second axis 126. Therefore the rotating element 106 can rotate about the second axis 126. The applied voltages from the sources 120 and 122 are typically about 30 V. The applied voltages from the sources 120 and 122 may be adjusted to independently control the angle between the frame 104 and the substrate 102, and the angle between the rotating element 106 and the frame 104.

As described above, the capacitance of the vertical comb-drives generally can be measured to monitor the angular positions of the rotating element 106 and the frame 104. Furthermore, capacitance across the comb fingers 115 and 117, or 111 and 113 may be used to sense the angular position of the rotating element 106. For example capacitance sensors 132 and 134 may be coupled to the comb fingers 111 and 115 respectively. The capacitance sensors 132, 134 may provide feed back to the voltage sources 120, 122 via controllers 136, 138. Capacitive position monitoring signals from the sensors 132, 134 may be used to implement closed-loop feedback control the angles of the rotating element 106 and the frame 104 via the sensors 136, 138. Therefore, capacitive angle signals may be used in a servo loop to actively control the position of the rotating element 106. Several alternate position sensing techniques, such as gap closing electrodes, additional comb fingers, piezoresistive strain gauges, coils, magnets, piezoelectric sensors, optical sensors and combinations thereof could be used instead of capacitive sensing from the comb fingers, and in tandem with the capacitive sensing feature of the present invention. Furthermore, a first position sensor element could be linked to configure a second position sensor element to achieve higher accuracy position sensing than otherwise provided by two unlinked sensors.

The present invention also provides significant advantages over existing vertical comb-drive actuators in its preferred fabrication method. Because the second comb fingers and first comb fingers are in the same vertical plane, they can be formed in a single step from a single multi-layer structure, providing for automatic alignment of the fingers. A method of fabricating a multi-layer vertical comb-drive structure such as that depicted in FIG. 1A is illustrated in FIGS. 2A–2E according to a second embodiment of the present invention. For a silicon-on-insulator (SOI) substrate, all of the steps can be performed using standard photolithography tools, an oxide etcher, and a deep reactive-ion silicon etcher, all of which are available in commercial fabrication foundries. The following describes exemplary methods for fabricating comb-drive actuators of the present invention. It is to be understood that other fabrication methods may be used to make such structures, and that structures made by other methods are within the scope of the present invention.

Figure 2A:
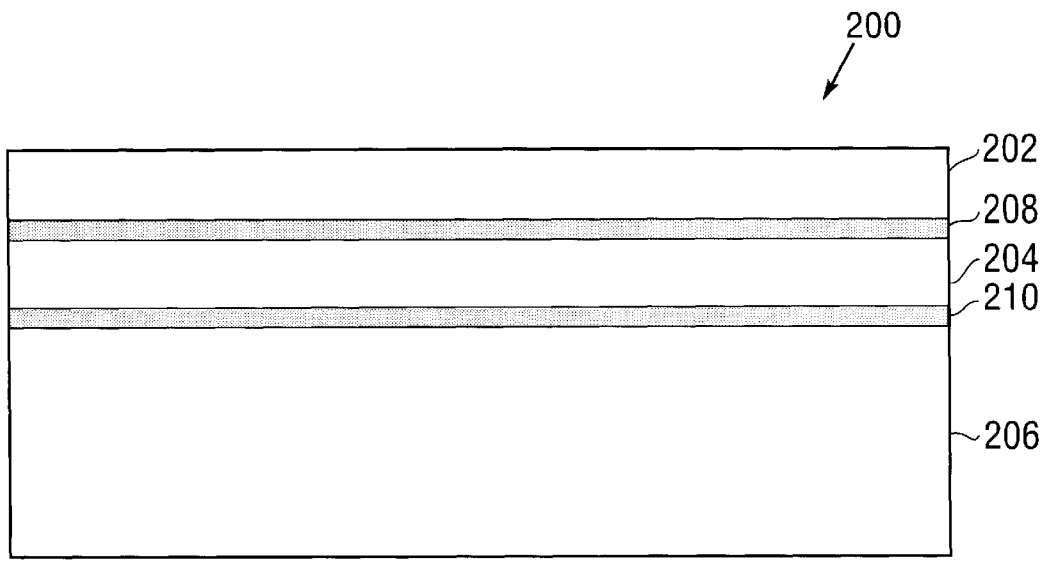
FIGS. 2A–2E are simplified cross-sectional views showing fabrication of a multi-layer comb-drive actuator according to a second embodiment of the present invention.

FIG. 2A shows a cross-sectional view of a multi-layer substrate 200 containing a first conductive layer 202, a second conductive layer 204, a first insulating layer 208, a optional second insulating layer 210, and an optional substrate layer 206. Conductive layers 202 and 204 and the substrate layer 206 may be made of any suitable material including, but not limited to silicon, silicon-germanium, silicon-carbide, nickel, and gold. Conductive layers 202 and 204 are preferably silicon. Insulating layers 208 and 210 may be made of any suitable insulating material including, but not limited to, silicon-nitride, silicon-oxide, silicon-carbide, quartz, high resistivity silicon, high resistivity silicon germanium, polyimide, or a polymeric film. Insulating layers 208 and 210 are preferably a silicon oxide formed by thermal oxidation of silicon conductive layers 202 and 204, which are then bonded together. The substrate layer 206 is preferably also silicon. Other substrates and combinations of materials may also be used in different fabrication processes.

Figure 2B:
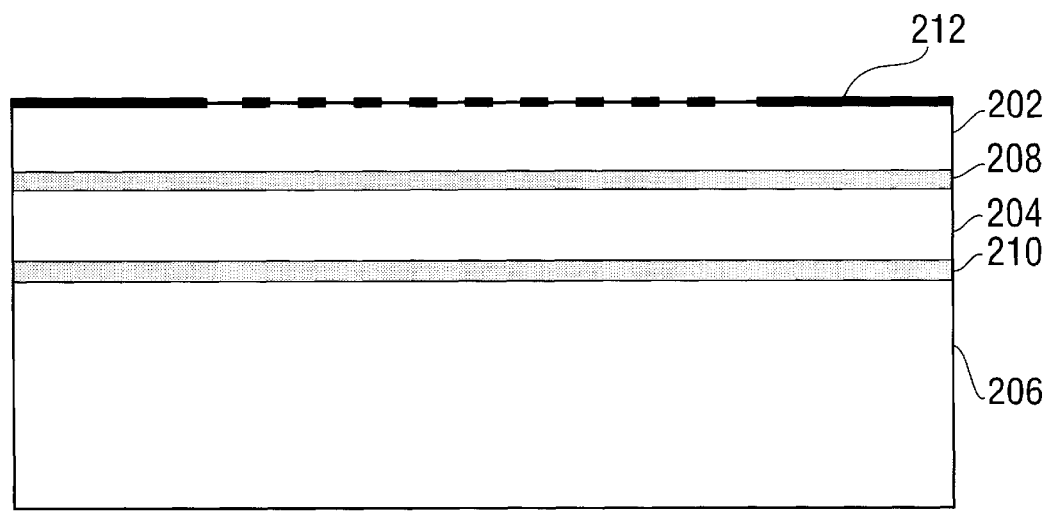
Figure 2C:
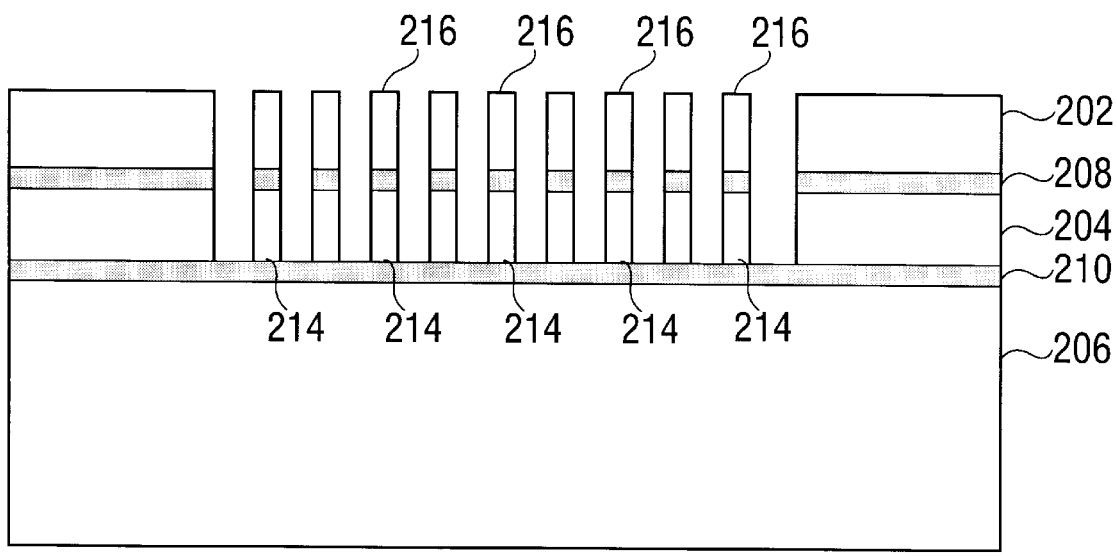
Figure 2D:
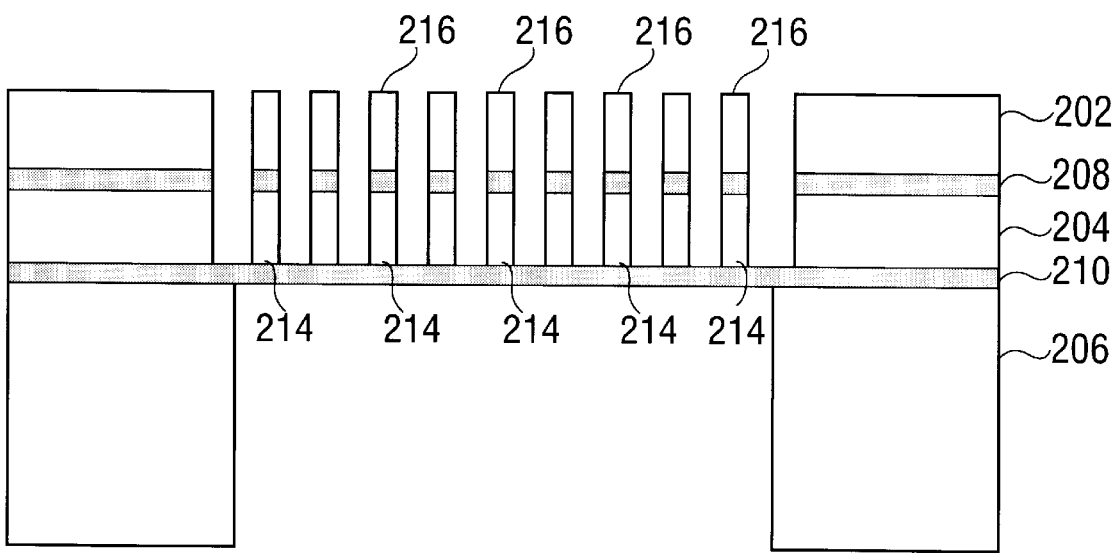
Figure 2E:
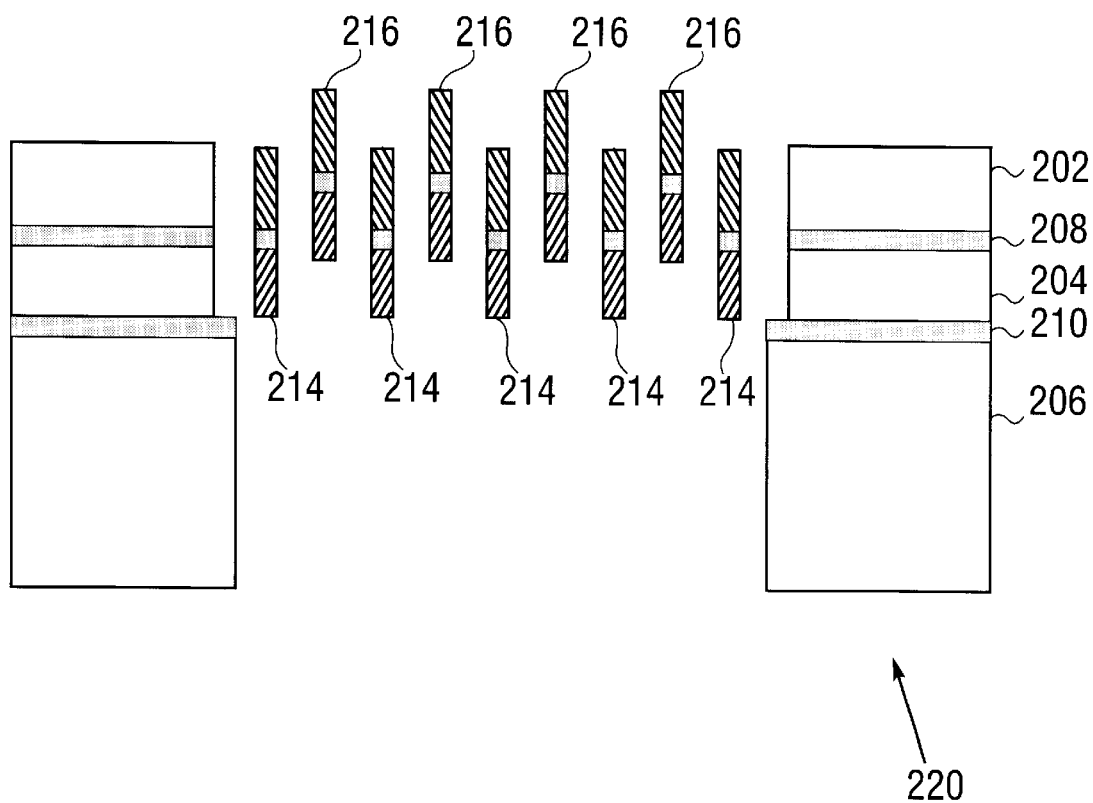

In FIG. 2B, a masking layer 212 (for example, photoresist or aluminum) is deposited and patterned on top of layer 202 defining a plurality of first and second comb fingers 214, 216 respectively as shown in FIG. 2C. Note that the pattern is not uniform in a direction perpendicular to the page, but rather forms a comb structure similar to those shown in FIGS. 1A–1C. FIG. 2C shows the comb fingers formed as a result of deep reactive-ion etching of first and second conductive layers 202 and 204 (e.g. silicon) and first insulating layer 208 (e.g. silicon oxide) of FIG. 2B, after removal of the remaining masking layer 212. In FIG. 2D, a portion of optional substrate layer 206 (e.g. silicon) is etched away to release a bottom surface of the comb fingers 214, 216, leaving first comb fingers 214 and second comb fingers 216. Second insulating layer 210 is also etched away either by anisotropic etching from the bottom side or by isotropic etching. Optional substrate layer 206 may instead be left intact, limiting motion of the second comb fingers 216 to only motion above the substrate. Note that second comb fingers 216 are connected to a second comb bridge in a plane parallel to the plane of the paper, either above or below the paper. The first insulating layer 208 is optionally removed. Operation of the resulting actuator 220 is shown in FIG. 2E. A potential is applied to the top layers of both the second and first (or stationary) comb fingers, while the bottom layers of both types of comb fingers are grounded. The potential can cause the second combs fingers 216 to move as shown.

Note that in the process illustrated in FIGS. 2A–2E, all of the comb fingers, both first and second, are formed in a single etch. Thus the proper alignment of the fingers is a result of precise fabrication of a single mask, which is easily attainable using standard techniques. Furthermore, it is possible to the reverse the order of the frontside and backside etch steps, e.g., by selectively etching away portions of the substrate 206 before etching the conductive layers 202, 204 and insulating layer 208 to define the comb fingers 214, 216.

Figure 3A:
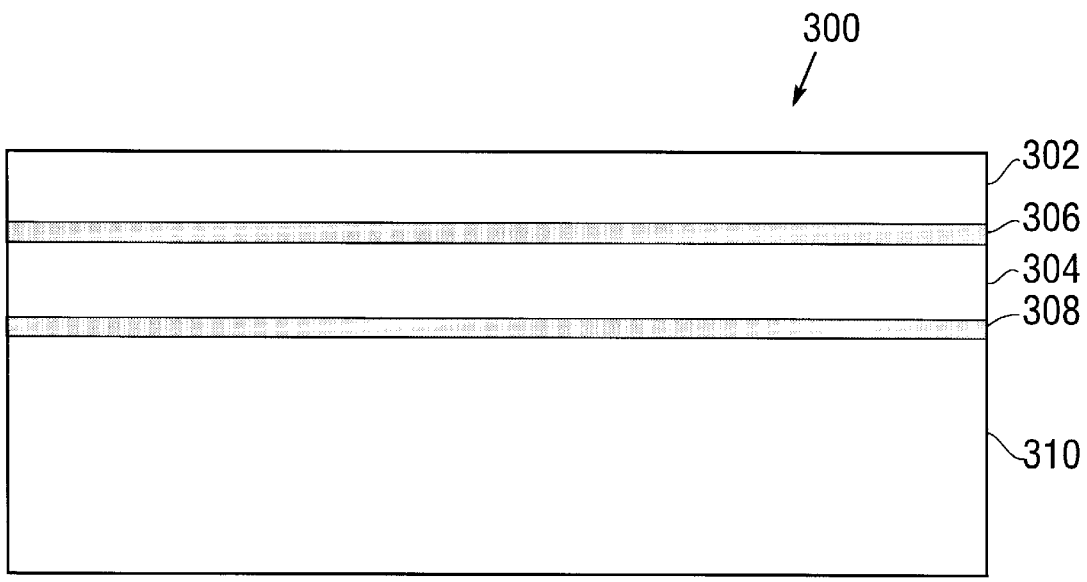
FIGS. 3A–3I are simplified cross-sectional views showing fabrication of a multi-layer comb-drive actuator according to a third embodiment of the present invention.

A third embodiment of the present invention is illustrated in FIGS. 3A–3I, which shows a method of fabricating a multi-layer vertical comb-drive structure of the type shown in FIGS. 1B–1C. In this method, one set of comb fingers has two layers, while the other has only one layer. FIG. 3A shows a structure 300 containing first conductive layer 302 and second conductive layer 304, and first and second insulating layers 306 and 308, respectively. Also shown is optional substrate layer 310. Structure 300 may be identical to substrate 200 of FIG. 2A. Conductive layers 302 and 304 are preferably silicon, while insulating layers 306 and 308 are preferably a silicon oxide formed from thermal oxidation of silicon wafer layers 302 and 3041 which are then bonded together.

Figure 3B:
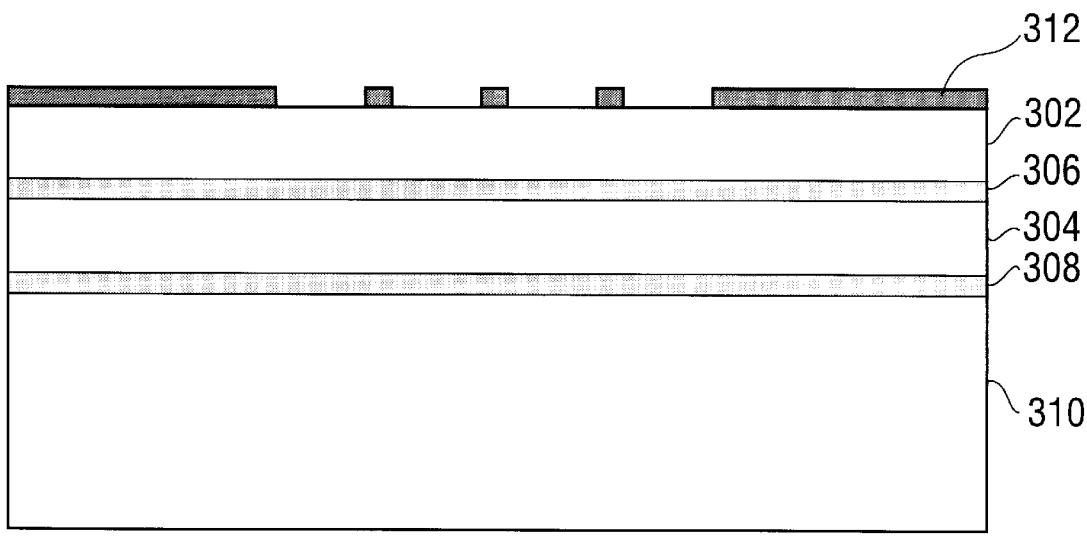
Figure 3C:
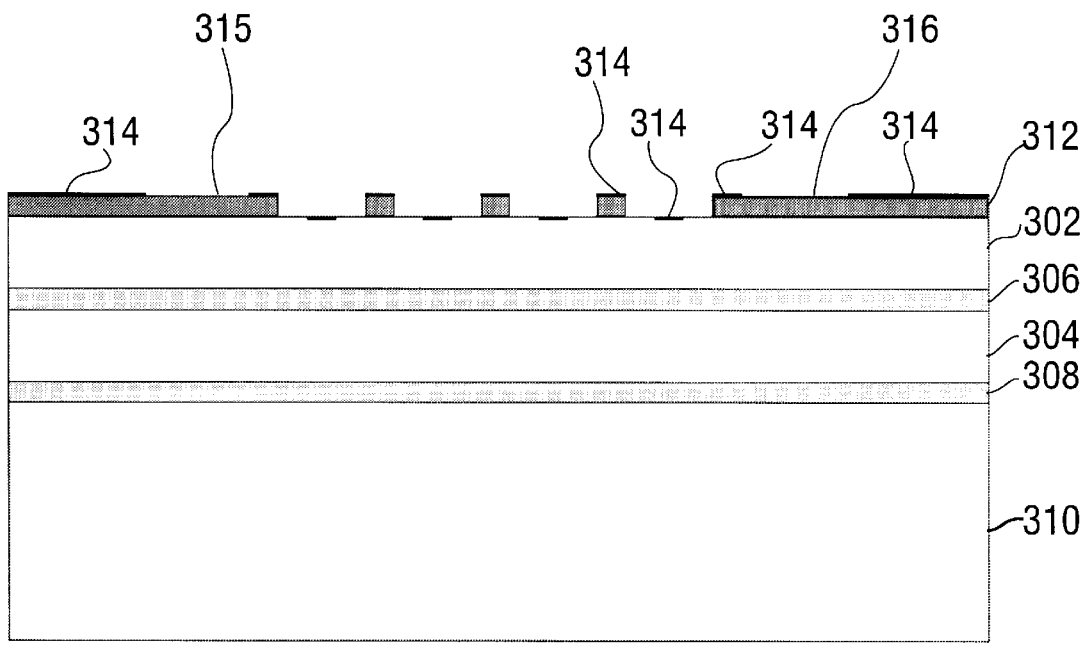
Figure 3D:
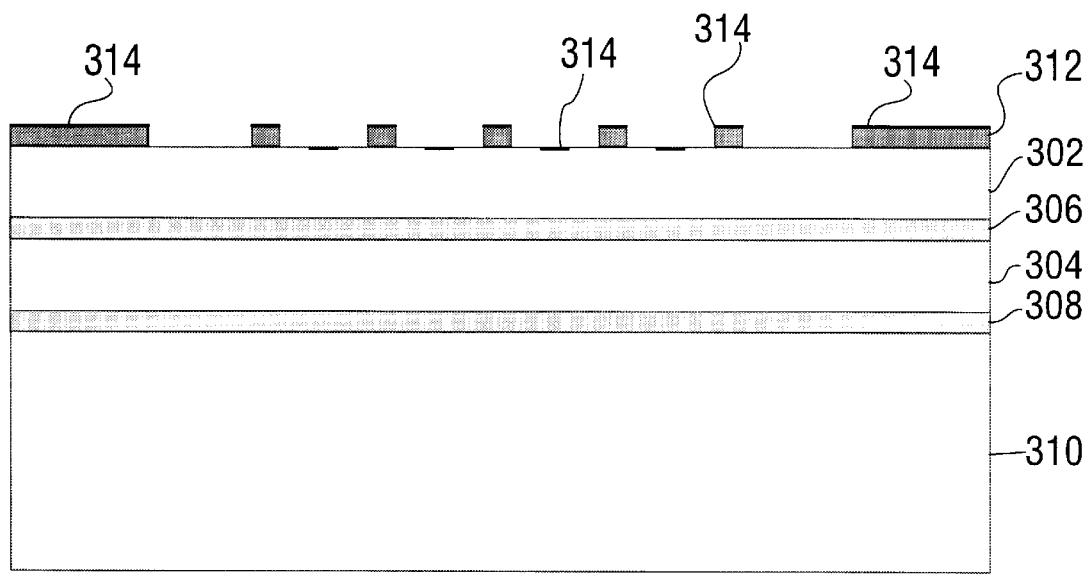
Figure 3E:
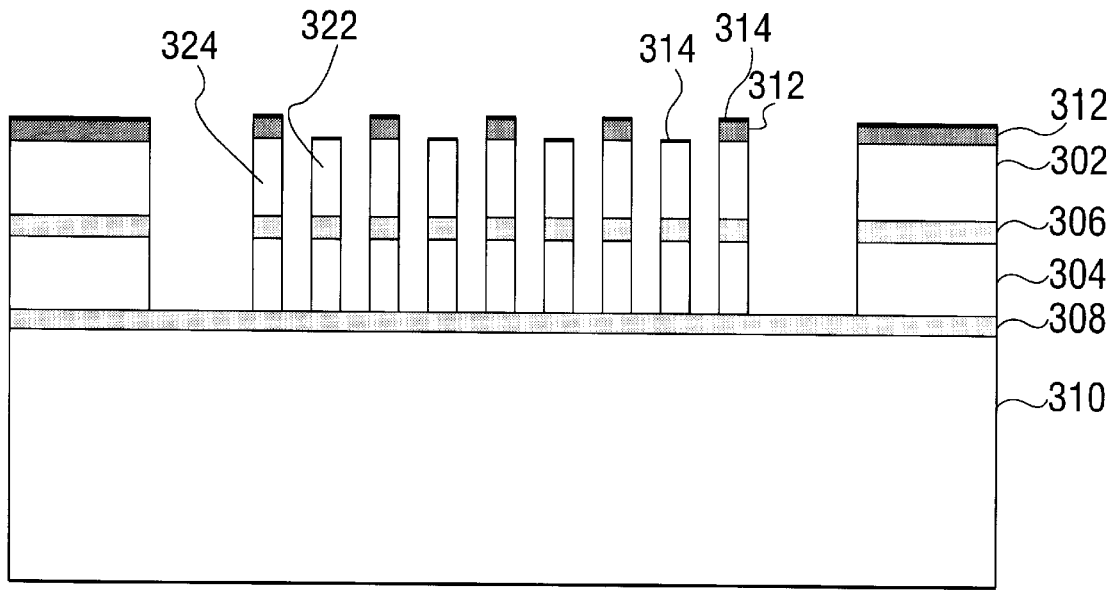
Figure 3F:
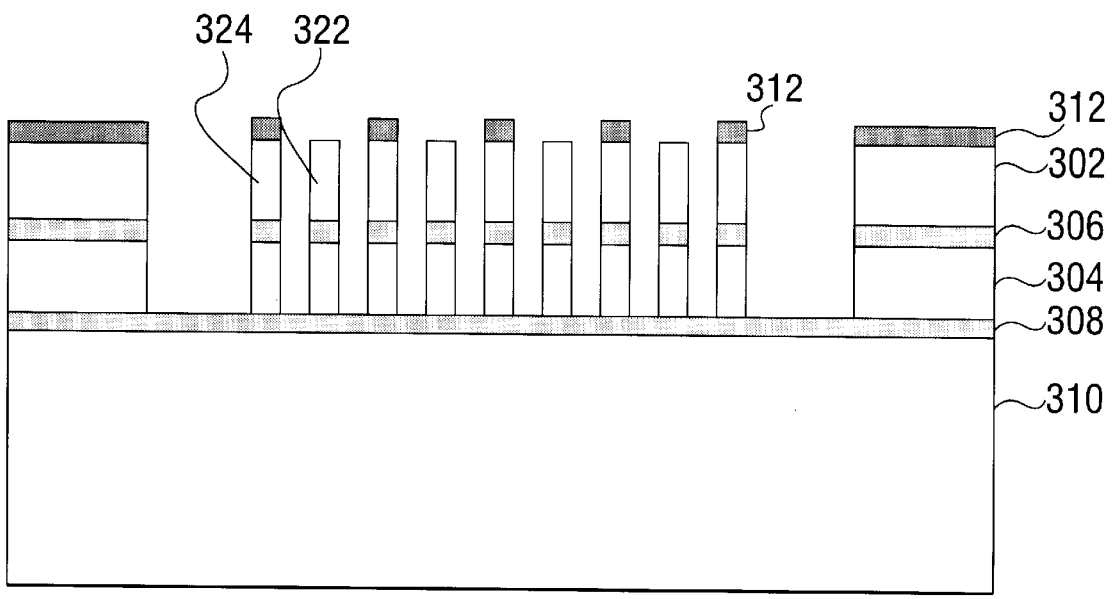
Figure 3G:
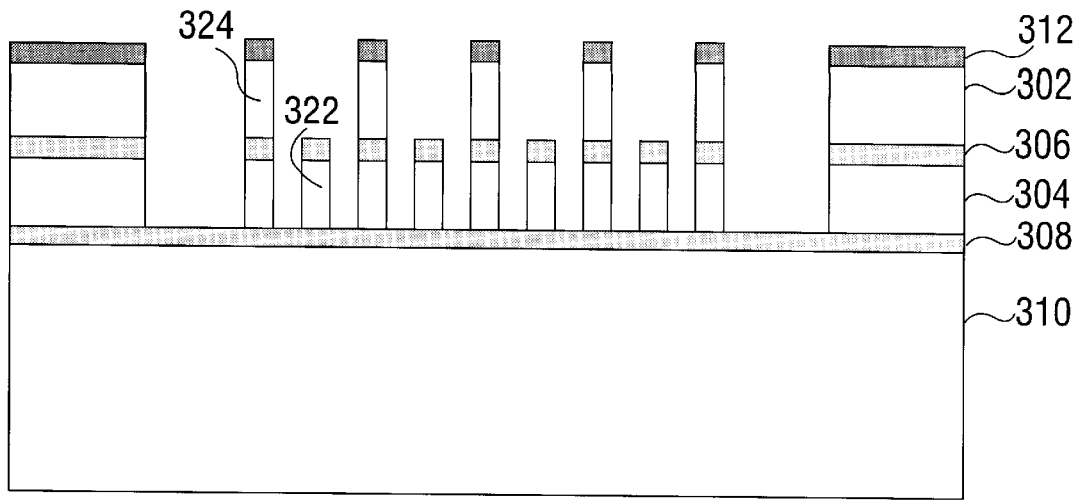
Figure 3H:
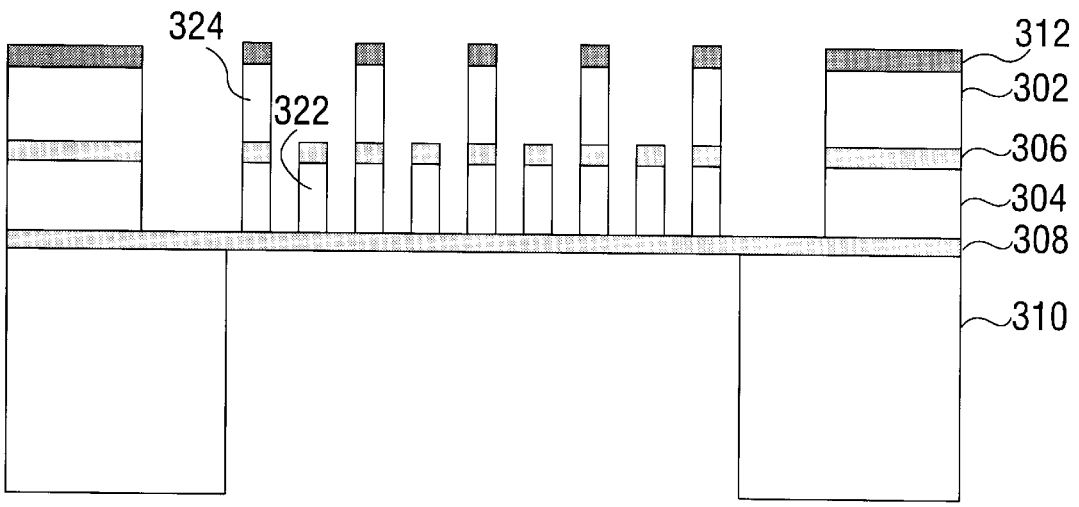
Figure 3I:
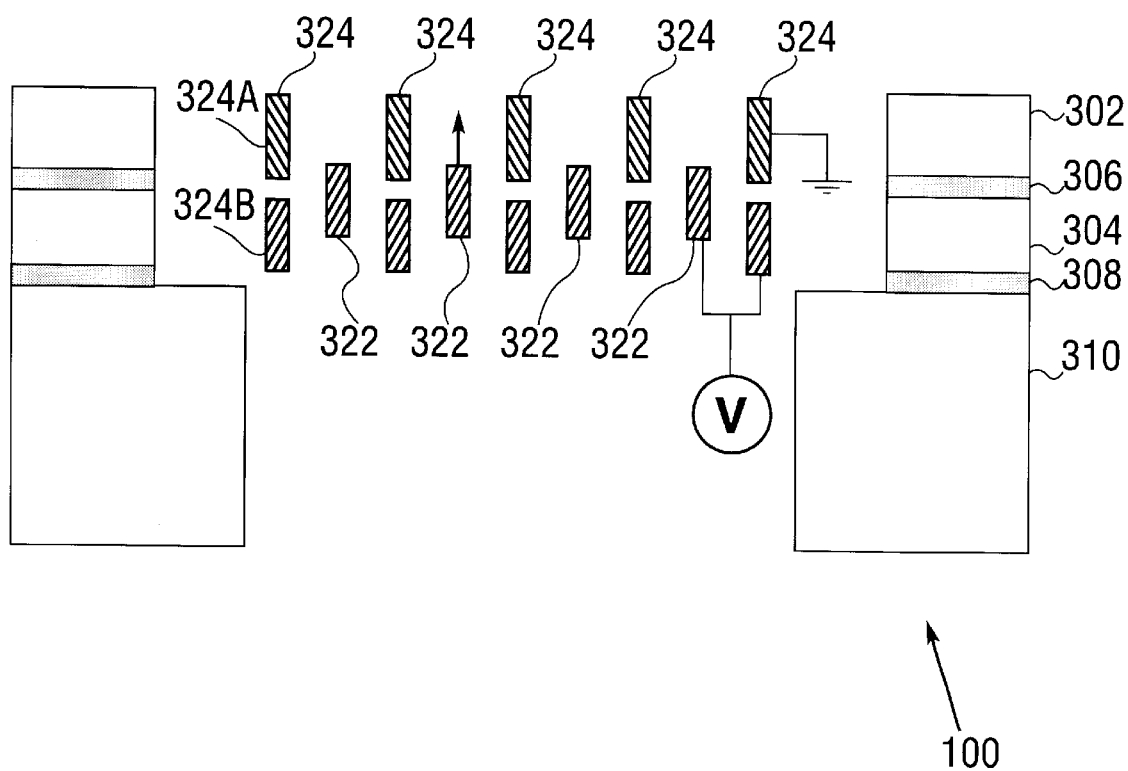

In FIG. 3B, a first masking layer 312 (e.g. silicon oxide, aluminum, photoresist) is deposited and patterned on top of first conductive layer 302. Some of the remaining portions of the masking layer cover areas that will eventually become the first comb fingers. Next, in FIG. 3C, a second masking layer 314 (e.g. photoresist) is deposited on top of first masking layer 312 and then removed according to a second pattern, defining the location of eventual comb fingers. Layers 312 and 314 contain different types of masking material, so that one can be selectively removed without affecting the other. In FIG. 3D, regions 316 of first masking layer 312 that are not covered by second masking layer 314 are removed. This ensures that the second mask 314 defines the comb structures. Therefore, the alignment between the first mask 312 and the second mask 314 does not affect the comb widths. Next, in FIG. 3E, first conductive layer 302, first insulating layer 316, and second conductive layer 304 are etched, e.g., using deep reactive-ion etching (DRIE) to create two sets of comb fingers 322, 324 that will respectively become second and first comb fingers. The second masking layer 314 is then removed to create the structure of FIG. 3F, which is etched using DRIE or other anisotropic silicon etching methods to remove the first conductive layer 302 from alternating comb fingers. The resulting structure is shown in FIG. 3G. The fingers are then undercut in FIG. 3H, followed by optional removal of portions of the first and second insulating layers 306 and 308 and remaining first masking layer 312 to reveal an actuator 330 of FIG. 3I. Insulating oxide layers may be removed using a timed HF etch. In the embodiment shown, second comb fingers 322 are connected to a second comb bridge in a plane parallel to the plane of the paper, either above or below the page. The second comb bridge may be connected to the substrate through a torsion hinge or flexure that allows movement of the second comb structure. One method to operate actuator 330 is to apply a voltage V to the second comb fingers 322 and a bottom layer 324B of the first comb fingers 324, while a top layer 324A of first comb fingers 324 is grounded, causing an electric force that moves the second comb fingers 322.

Note that the method illustrated in FIGS. 3A–3I can also be used to create an actuator in which the first comb fingers have a single layer and the second fingers have two layers, in which case application of a voltage causes the second fingers to rotate downward. This method requires slightly different patterning of the two types of masking layers.

Actuators of the present invention may be used for any suitable application. Two-dimensional actuators may be fabricated using similar processes. Depending on the application needed, additional steps may be added into the fabrication process to create an integrated device. Metals may be evaporated, sputtered, or electroplated onto the substrate using methods known in the art.

In both embodiments of the fabrication method shown, all of the fingers are formed in a single process in a single multi-layer wafer structure, thus providing for very high precision in alignment of the comb fingers.

It will be clear to one skilled in the art that the above embodiment may be altered in many ways without departing from the scope of the invention. Accordingly, the scope of the invention should be determined by the following claims and their legal equivalents.

What is claimed is:

1. A method of fabricating a multi-layer vertical comb-drive structure comprising:
   a) providing a multi-layer structure, the multi-layer structure including:
      i) a first conductive layer;
      ii) a second conductive layer;
      iii) a first insulating layer disposed between the first conductive layer and the second conductive layer; and
   b) etching a pattern in the first conductive layer, the insulating layer, and the second conductive layer, wherein the pattern defines a plurality of comb fingers of a first comb structure that interdigitate with a plurality of comb fingers of a second comb structure.

2. The method of claim 1, wherein the multi-layer structure includes a second insulating layer disposed between the second conductive layer and a substrate layer.

3. The method of claim 2, wherein the substrate includes a material selected from the group consisting of silicon, silicon-germanium, silicon-carbide, nickel, and gold.

4. The method of claim 1 further comprising etching a portion of the second insulating layer and a portion of the substrate layer to release the comb structures.

5. The method of claim 1 further comprising disposing a masking layer on top of the first conductive layer prior to step b).

6. The method of claim 5 further comprising, prior to said step b), removing selected portions of the masking layer to expose selected portions of the first conductive layer.

7. The method of claim 6 wherein step b) includes etching the exposed portions of the first conductive layer, the first insulating layer and the second conductive layer.

8. The method of claim 7, wherein the selected portions are exposed by disposing a second masking layer over selected portions of the masking layer, wherein the second masking layer is resistant to an etch process that removes portions of the masking layer that are not covered by the second masking layer.

9. The method of claim 8 wherein step b) includes etching the exposed portions of the first conductive layer, the first insulating layer and the second conductive layer.

10. The method of claim 9, further comprising removing selected portions of the second masking layer to expose portions of the first conductive layer.

11. The method of claim 10 further comprising etching the exposed portions of the first conductive layer.

12. The method of claim 11, wherein the multi-layer structure includes a second insulating layer disposed between the second conductive layer and a substrate layer.

13. The method of claim 12 wherein the second insulating layer includes a material selected from the group consisting of silicon-nitride, silicon-oxide, silicon-carbide, quartz, high resistivity silicon, high resistivity silicon germanium, polyamide, or a polymeric film.

14. The method of claim 12 wherein the substrate layer includes a mterial selected from the group consisting of silicon, silicon-germanium, silicon-carbide, nickel, and gold.

15. The method of claim 12, further comprising etching one or more portions of substrate layer and the second insulating layer.

16. The method claim 1, wherein one or more of the first and second conductive layers include a material selected from the group consisting of silicon, silicon-germanium, silicon-carbide, nickel, and gold.

17. The method of claim 1, wherein the insulating layer includes a material selected from the group consisting of silicon oxide, silicon nitride, silicon carbide, high resistivity silicon, high resistivity silicon germanium, quartz, polyamide, and a polymeric film.

* * * * *